United States Patent [19]
Singh

[11] Patent Number: 5,558,789
[45] Date of Patent: Sep. 24, 1996

[54] METHOD OF APPLYING A LASER BEAM CREATING MICRO-SCALE SURFACE STRUCTURES PRIOR TO DEPOSITION OF FILM FOR INCREASED ADHESION

[75] Inventor: Rajiv K. Singh, Gainesville, Fla.

[73] Assignee: University of Florida, Gainesville, Fla.

[21] Appl. No.: 204,509

[22] Filed: Mar. 2, 1994

[51] Int. Cl.⁶ .................................................. B23K 26/00
[52] U.S. Cl. .................................. 219/121.69; 427/307
[58] Field of Search .................................. 216/34, 35, 39, 216/65; 427/307, 309, 314, 554, 555, 556; 219/121.66, 121.69, 121.84, 121.85, 121.7, 121.71; 148/565, 525

[56] References Cited

U.S. PATENT DOCUMENTS

| | | | |
|---|---|---|---|
| 4,348,263 | 9/1982 | Draper et al. | 219/121.85 |
| 4,504,726 | 3/1985 | Hosaka et al. | 219/121.68 |
| 4,745,018 | 5/1988 | Chihara et al. | 219/121.85 |
| 4,803,335 | 2/1989 | Steen et al. | 219/121.84 |
| 4,968,383 | 11/1990 | Volkmann et al. | 219/121.66 |
| 5,417,896 | 5/1995 | Fischer et al. | 216/65 |
| 5,435,889 | 7/1995 | Dietrich | 427/309 |

FOREIGN PATENT DOCUMENTS

| | | | |
|---|---|---|---|
| 3829414 | 3/1990 | Germany | 427/307 |
| 61-238986 | 10/1986 | Japan | 219/121.69 |
| 64-48685 | 2/1989 | Japan | 219/121.68 |

Primary Examiner—Geoffrey S. Evans
Attorney, Agent, or Firm—Thomas C. Saitta

[57] ABSTRACT

A method of producing an improved adherent interface between a film or coating and a substrate of metal, ceramic, or composite material by laser treatment of the surface. Semi-periodic microscale surface structures of less than 200 microns in magnitude are made by laser radiation of at least 50 pulses with an energy density of 0.01 to 15 J/cm² and a duration of 100 femtoseconds to 1 millisecond on each surface area treated.

19 Claims, 5 Drawing Sheets

METHOD OF APPLYING A LASER BEAM CREATING MICRO-SCALE SURFACE STRUCTURES PRIOR TO DEPOSITION OF FILM FOR INCREASED ADHESION

BACKGROUND OF THE INVENTION

This invention relates generally to a method for improving thin film or coating adhesion on substrates, and more particularly to such a method for improving adhesion of thin films, such as diamond, TiN or yttria stabilized zirconia films, on substrates for use as cutting tool coatings, wear resistant coatings, corrosion resistant coatings, thermal barrier coatings and other applications. The method produces an improved interface between the bulk substrate material and the adhered film because of the initial surface preparation techniques.

Cutting tools for cutting hard materials are subject to wear and failure directly related to the stresses created in cutting the hard material. To prolong the cutting tool life, such tools are fabricated from extremely hard materials, such as for example 1–15% Co/WC, $Si_3N_4$, SiAlON, SiC or tool steel. Adherence of a thin film composed of an even harder and non-reactive material, such as for example diamond, TiN or BN, to the base material of the cutting tool can increase the strength and wearability of the cutting tool. To date, however, the techniques for adhering the film to the cutting tool substrate have not produced an optimum interface, and the film usually fractures or delaminates from the substrate after minimal use.

Improved thin film adhesion is also desirable in many other applications. These include situations where it is necessary to protect substrates from environmental, temperature or wear effects. For example, ceramic coatings such as TiN or MgO are useful for environmental and corrosion protection. Coatings such as yttria stabilized zirconia provide thermal barriers to nickel superalloys and the like.

It is an object of this invention to provide an improved substrate/film interface, whereby the adhesion of the film to the substrate, is greatly improved, such that delamination or failure will not occur during use.

It is a further object to provide such an improved interface by increasing the surface area of the base material prior to film deposition by using a laser technique to induce micro-scale surface structures, followed by chemical or physical vapor deposition of the film onto the substrate.

SUMMARY OF THE INVENTION

The invention comprises a method for producing an improved adhesive interface between a thin film or coating and a base material substrate, and the thin film/substrate interfaces produced by this method. In general, the surface of the substrate material is first treated using a laser technique to dramatically increase the surface roughness and surface area, as described in my U.S. Pat. No. 5,473,138, issued Dec. 5, 1995. This technique comprises irradiating the surface with multiple laser pulses within certain parameters. Material removal at the surface of the cutting tool occurs to a depth of up to 200 microns in a non-uniform manner, resulting in the formation of periodic or semi-periodic morphological structures on a scale of from ¼ to several hundred microns. The surfaces produced by this method comprise structures in the form of cones, columns, peaks, fingers, grooves and valleys, probably due to preferential spatial absorption of the laser beam. The beam is scanned to induce change over as much of the surface as desired.

The wavelength of the laser can be from ultraviolet to infrared. The beam is relatively unfocused, with an energy density of from 0.01 to 15 $J/cm^2$. A large number of pulses are utilized, with 50 pulses being a minimum and at least 200 pulses being preferred, and the pulses have a duration of from 100 femtoseconds to 1 millisecond. The particular values utilized are dependent on the particular material being treated, with characteristics of reflectivity, thermal absorption, thermal conductivity, density and specific heat being taken into account. In general, the shorter the pulse duration, the lower the necessary energy density. This methodology produces an increase in micro-roughness and surface area of up to two orders of magnitude.

For some materials, the second step comprises subjecting the modified surface to a cleansing or etching treatment. For example, for cutting tools fabricated of cobalt containing materials, it is desirable to perform an acid etch using HCl to remove the surface cobalt, since the presence of cobalt on the surface decreases adhesion of the film and is a graphitizing agent to diamond deposition.

It is also possible to perform the surface modification and etching steps simultaneously by applying the laser with the substrate immersed in an acid solution.

Thirdly, a thin film or coating of a material having desirable properties different from the substrate material is deposited onto the modified surface of the substrate using conventional chemical vapor deposition (CVD) or physical vapor deposition (PVD) techniques. The resulting film/surface interface is vastly improved over conventional methods, such that the film does not delaminate or fracture from the substrate material under extreme test conditions.

DETAILED DESCRIPTION OF THE INVENTION

Figure 1:
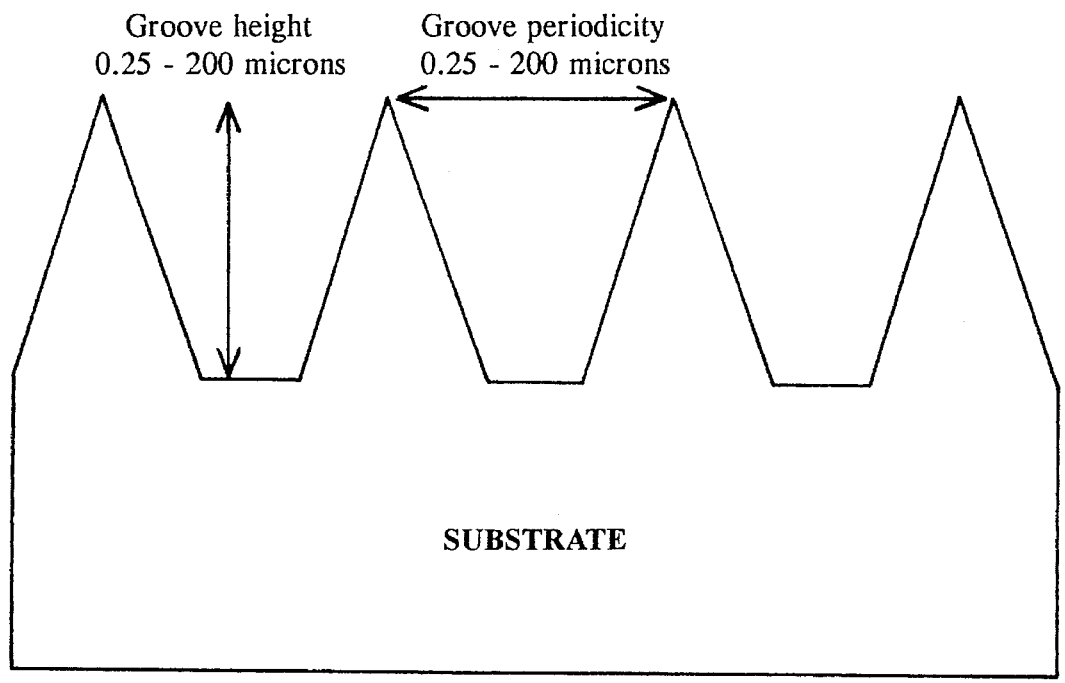
FIG. 1 is a schematic showing the surface morphology of a substrate after initial laser treatment.

With reference to the FIGURES and photographs, the invention will now be disclosed in detail. The invention comprises the process for creating an improved interface between a substrate material and an adhered film or coating of a material having properties different from those of the substrate, as well as the film/substrate interfaces themselves produced by this process. By way of example, the process is applicable to improved cutting tools where a diamond thin film is adhered to the base material of the tool. In general, the process comprises treating the surface of the substrate material by a laser technique to greatly increase surface area through the creation of semi-periodic morphological structures on a micro-scale. The material surface is altered to a maximum depth of 200 microns, such that the bulk properties of the material are not affected by the technique. Surface roughness and surface area can be increased by up to a factor of 100.

No specific pre-treatment is required for the material to be irradiated by this technique. Masking is not necessary, as it is desirable to shape all the exposed surface to increase surface area. Ceramic and ceramic composite materials can be irradiated at ambient temperature and pressure, in normal atmosphere. The technique can also be employed with ceramic and ceramic composites in controlled atmosphere situations, such as with the use of reactive or non-reactive gases. For metal surfaces, the irradiation must occur under vacuum or at low pressure (less than 760 torr) to prevent melt flow behavior and shock wave effects. Shock wave effects can also be reduced on metals by performing the technique in light gas atmospheres, such as hydrogen or helium.

Standard lasers capable of producing beams within the prescribed parameters can be employed. In the examples given later, a Questek V-beta Series 2000 laser was used. The laser wavelength can be varied by the use of different rare gas/halide gas combinations (e.g., 193 nanometers using ArF gas, 248 nanometers using KrF gas or 308 nanometers using XeCl gas), and in the examples the 248 nanometer wavelength was employed. Suitable wavelengths range from ultraviolet to infrared, and beam energy densities ranging from 0.01 to 15 $J/cm^2$ are utilized depending on the particular material. The laser must be able to be rapidly pulsed, preferably with durations of from 100 femtoseconds to 1 millisecond, with the preferred pulse duration being from 15 to 25 nanoseconds. Pulse repetition rates from 0.01 to several KHz may be utilized.

The particular energy density and duration is variable and is dependent on the particular material being treated and the extent of surface roughness desired. Additionally, surface morphology can be controlled by these factors as well as by the angle of incidence of the beam.

The key step in the method is the use of a high number of low energy laser pulses to affect a given area. At least 50 pulses, and preferably at least 200 pulses, are irradiated on a single area, with the beam energy being less than 15 $J/cm^2$, and preferably from 2 to 8 $J/cm^2$ and even more preferably less than 4 $J/cm^2$. This minimum number of pulses is much higher and this maximum beam energy is much lower than is typically used in laser treatment of surfaces. As many as 100,000 pulses or more can be used on a single area. The laser may be scanned over the material surface to produce increased roughness and surface area over a large range.

The surface of the substrate is irradiated with at least 50 pulses of a laser beam in the UV to infrared wavelength range having an energy density of between 0.01 to 15 $J/cm^2$, and most preferably from 2 to 4 $J/cm^2$, with pulse durations of from 100 femtoseconds to 1 millisecond. Surfaces containing metal must be irradiated in vacuum or with light gases to prevent melt flow and shock wave effects. Selective absorption of the beam results in the formation of semi-periodic surface structures having magnitudes of less than 200 microns, resulting in dramatically increased surface area without affecting the bulk properties of the material. FIG. 1 is a schematic showing the morphology of the substrate surface after completion of this step.

The improved adhesion of this method is due to the creation of a three dimensional mechanically, compositionally and thermally graded interface extending from submicrons to 100 microns across the perpendicular dimension of the film. Improved adhesion between the substrate and the film occurs because the thermal stresses are graded across the interface, the graded interface achieves grading of the mechanical stresses, the surface interfacial area is greatly increased, periodic valleys and open structures enhance CVD or PVD coverage, and contaminants and other unwanted materials are better removed in the etching process.

Figure 3:
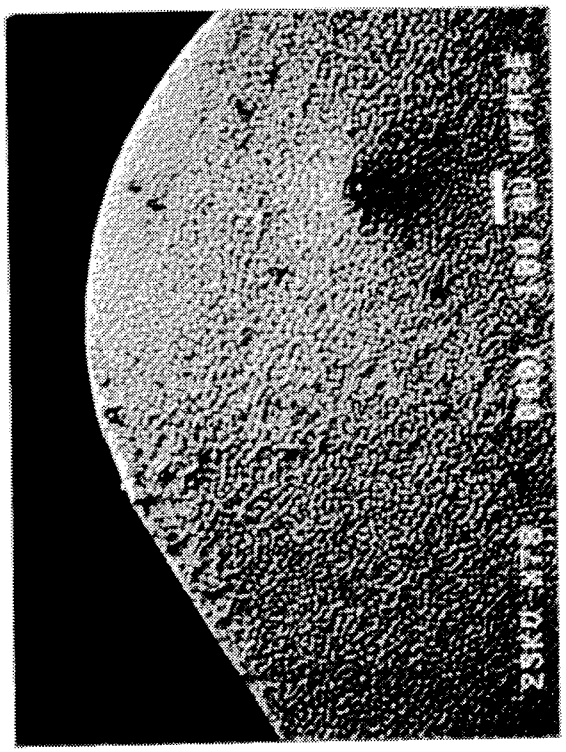
FIG. 3 is a photograph showing the surface of a cutting tool as modified by the laser treatment.

FIG. 3 shows the surface of a 6% Co/WC cutting tool (TPG 222 supplied by the Green Leaf Corp.) after laser treatment. The height of the surface structures is approximately 30 microns, while thee periodicity is approximately 10 to 15 microns. This sample was prepared by using an excimer laser at 2.0–3.0 $J/cm^2$ with 500 pulses.

After the initial laser treatment step, the surface of the cutting tool is cleansed or etched to remove any contaminants, adhesion inhibitors or graphitizing agents. Where the cutting tool is composed of a material containing cobalt, such as for example 10% Co/WC or TiC, it is particularly important to etch away any surface cobalt using a HCl solution, especially if the adhered film is to be diamond. It is also possible to perform the laser treatment on a substrate immersed in an acid solution, such that the laser and etching steps are accomplished at the same time.

Figure 2:
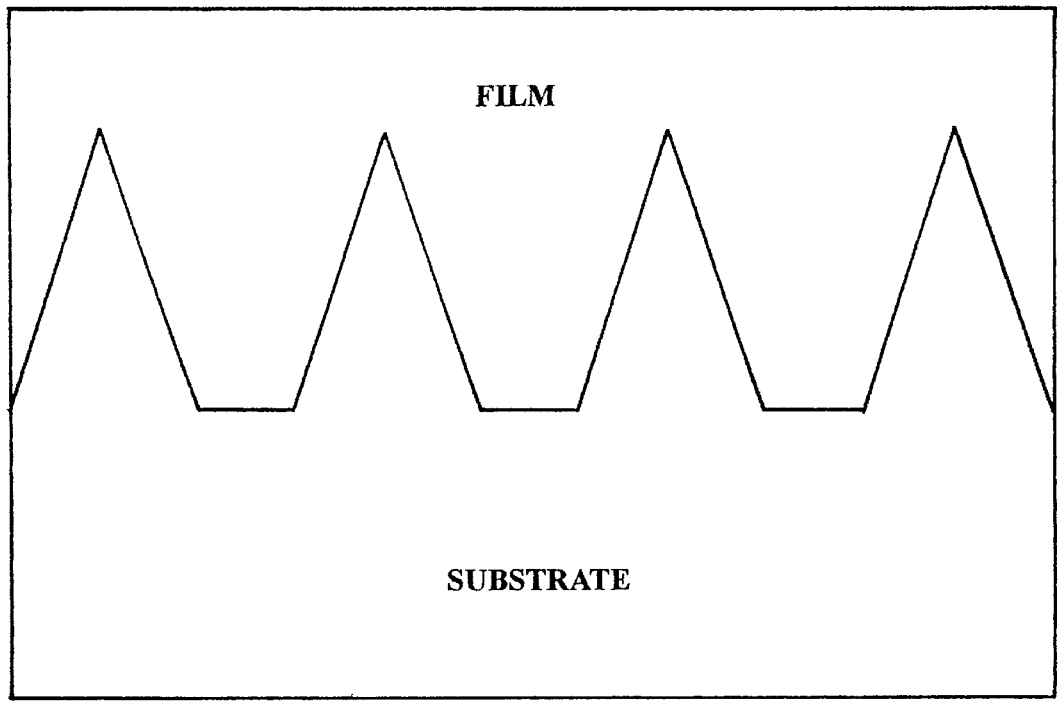
FIG. 2 is a schematic showing the surface of the substrate after completion of the process.

Finally, a thin film or coating of a material having desirable properties different from the substrate is deposited onto the modified substrate using conventional chemical vapor deposition or physical vapor deposition techniques, well known to those skilled in the art. The film is preferably of a thickness between 0.25 to 250 microns, but can be greater if desired. FIG. 2 is a schematic showing the film/substrate interface after the process has been completed.

Figure 4:
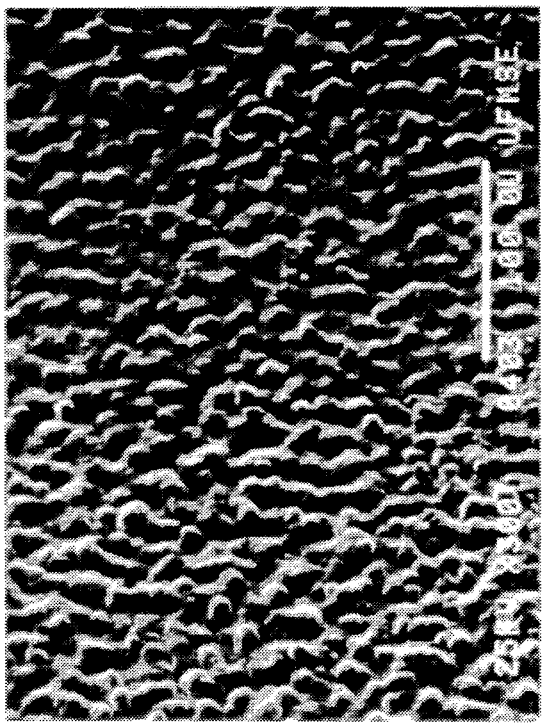
FIGS. 4, 5 and 6 are photographs at different magnifications showing an adhered diamond film on a cutting tool substrate after laser modification.
Figure 5:
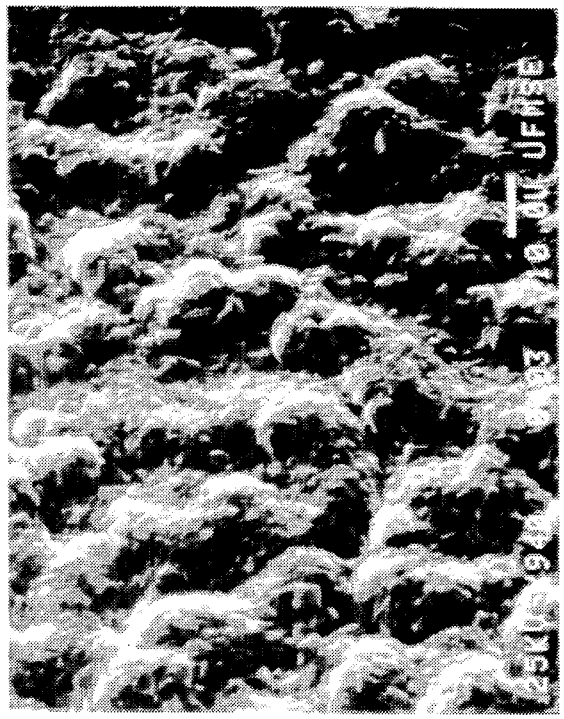
Figure 6:
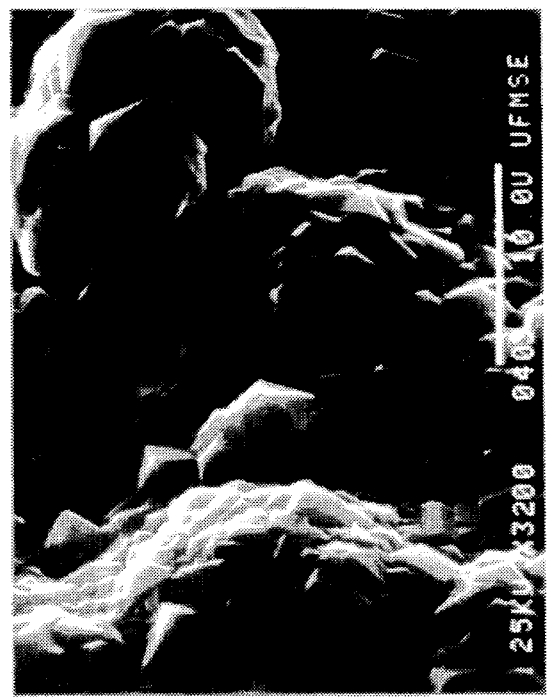

FIGS. 4, 5 and 6 show different magnifications of a CVD diamond film adhered to a 10% Co/WC substrate. The sample was prepared by laser treatment of 2.5–3.5 $J/cm^2$ at 248 nm and 500 pulses, followed by an acid etch for 20 minutes in 12M HCl. The diamond film was deposited using the hot filament CVD process after first scratching the surface with diamond powder to enhance nucleation, under the following conditions: tungsten filament at 1900–2100 degrees C., hydrogen gas plus 0.5–5% methane and 0.5–5% oxygen, carbon/oxygen species ratio ranging from 1:0.1 to 1:2.0, substrate temperature 800–1000 degrees C., gas flow rate 10–25 sccm, and deposition time 2–4 hours. The film is uniformly adhered and has diamond grains from 1 to 5 microns which overlap because of the high nucleation density. Such small grain size and high nucleation density improves the fracture toughness of the film. Deposition of the film is preferential to the valleys of the substrate, which provides a smoother surface than that of the original substrate after laser treatment. Thicker diamond coatings, or successive coatings with polishing intermediary steps, would result in even smoother surfaces.

Figure 7:
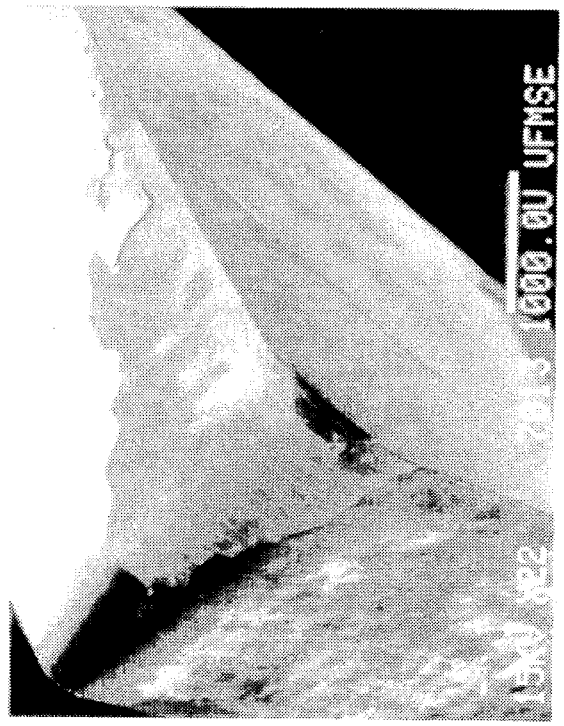
FIG. 7 is a photograph of a partially delaminated diamond film deposited without laser modification on a cutting tool substrate after its use to machine a sample.

FIG. 7 shows a commercial carbide tool (TPG 222 manufactured by the Greenleaf Corp.) which was diamond coated by CVD without modification of the surface by laser.

The diamond film was deposited using the hot filament CVD process after first scratching the surface with diamond powder to enhance nucleation, under the following conditions: tungsten filament at 1900–2100 degrees C., hydrogen gas plus 0.5–5% methane and 0.5–5% oxygen, carbon/oxygen species ratio 1:1, substrate temperature 800–1000 degrees C., gas flow rate 10–25 sccm, and deposition time 2–4 hours. The sample was then tested by cutting an Al6061 alloy. As seen in the photo, significant delamination and fracture occurred almost immediately. There is poor adhesion of the film to the substrate.

Figure 8:
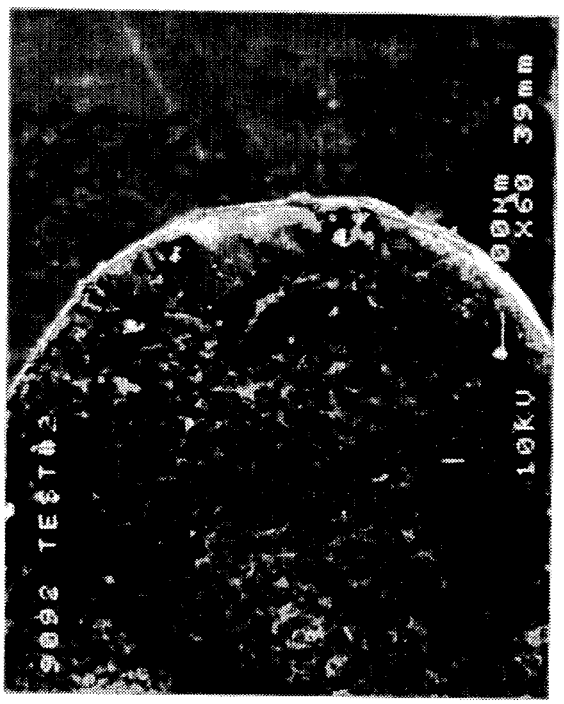
FIGS. 8 and 9 are photographs of an adhered diamond film on a cutting tool substrate after laser modification and after its use to machine a sample.
Figure 9:

FIGS. 8 and 9 show two views of a diamond coated carbide tool (TPG 222), prepared using the process of the invention, which was subjected to cutting a metal matrix composite of gamma TiAl with an approximately 7% dispersed titanium diboride, a much harder material than Al6061 alloy, for 5 minutes. The tool was prepared by laser modifying the surface at 2.5–3.5 J/cm$^2$ for 500 pulses. The surface was then etched in a 12M HCL solution for about 20 minutes. The diamond film was deposited using the hot filament CVD process after first scratching the surface with diamond powder to enhance nucleation, under the following conditions: tungsten filament at 1900–2100 degrees C., hydrogen gas plus 0.5–5% methane and 0.5–5% oxygen, carbon/oxygen species ratio 1:1, substrate temperature 800–1000 degrees C., gas flow rate 10–25 sccm, and deposition time 2–4 hours. As seen, the film adhered with the process of the invention shows no major wear, delamination or fracture.

Figure 11:
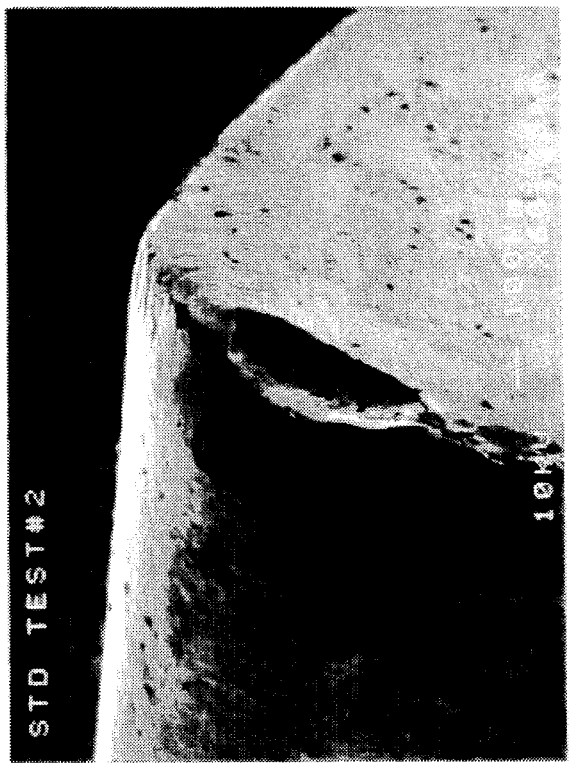
FIGS. 10 and 11 are photographs of an uncoated cutting tool after machining a sample.
Figure 10:
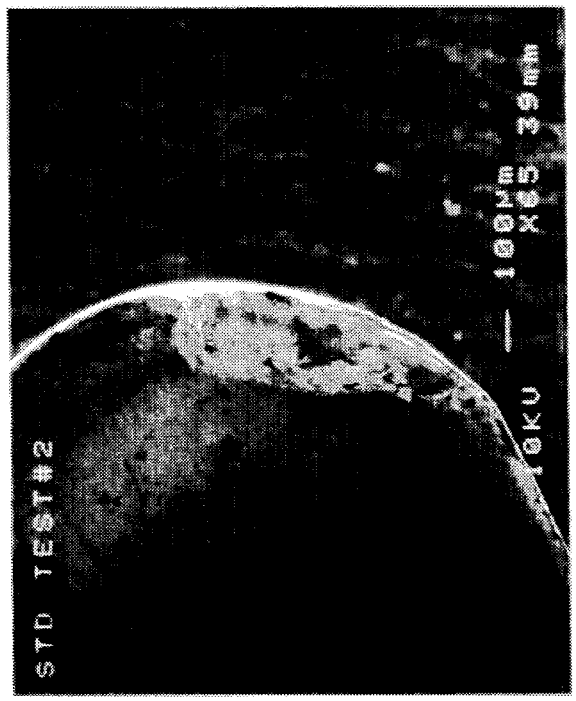

For comparison, FIGS. 10 and 11 show a non-coated carbide cutting tool (TPG 222) after cutting a metal matrix composite of gamma TiAl with 7% dispersed titanium diboride for only 40 seconds. The uncoated tool shows cavitation already present, which leads to failure of the tool.

Figure 12:
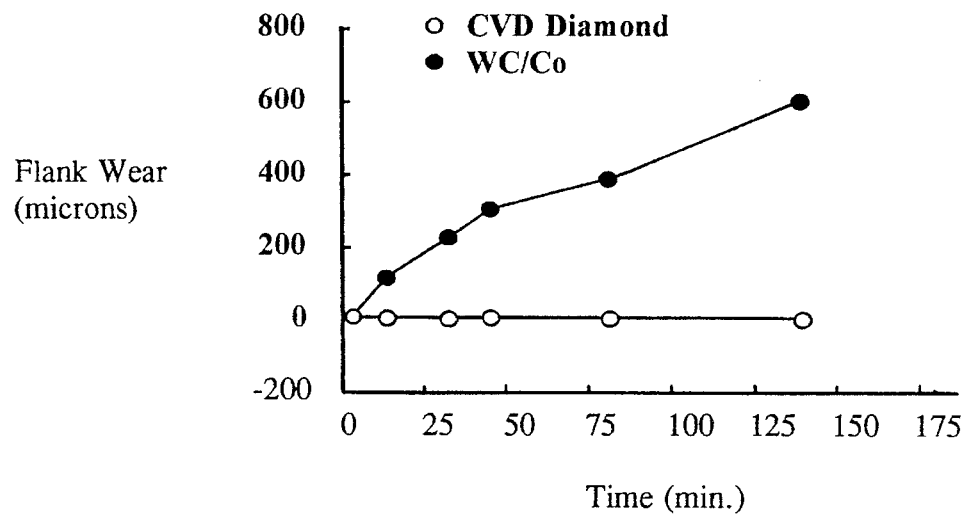
FIG. 12 is a graph comparing test results between uncoated and coated cutting tools after machining a relatively soft material.
Figure 13:
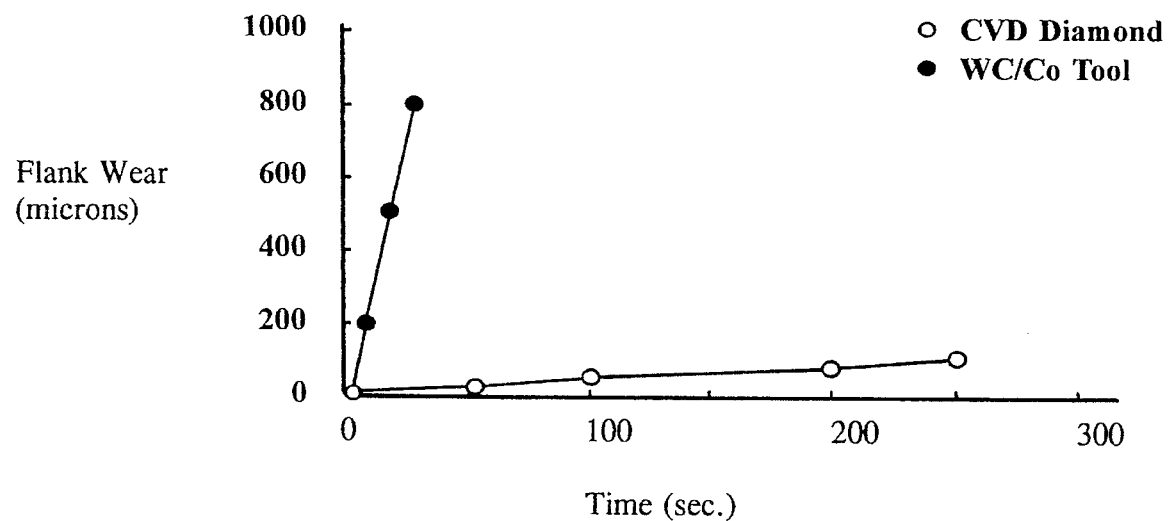
FIG. 13 is a graph comparing test results between uncoated and coated cutting tools after machining a relatively hard material.

FIG. 11 is a graph showing test results for machining Al6061 alloy for uncoated versus coated cutting tools prepared by the process of the invention. Cutting speed was approximately 1000 fpm and the depth of the cut was 0.04 inches. The coated tool showed virtually no wear over the course of the test, about 140 minutes, whereas the uncoated tool showed immediate and significant wear. FIG. 12 is a similar graph showing test results for machining the much harder metal matrix composite of gamma TiAl with 7% dispersed titanium diboride, conducted intermittently at 50 fpm. Again, it is seen that the uncoated tool wears much more rapidly.

The above examples are by way of illustration and it is understood that obvious equivalents and substitutions may be apparent to those skilled in the art. The full scope and definition of the invention therefore is to be as set forth in the following claims.

I claim:

1. A method for adhering a thin film to a metal, ceramic or composite material substrate, comprising the steps of:

(A) providing a laser for producing a beam of radiation having a wavelength within the ultraviolet to infrared range, an energy density within the range of 0.01 to 15 J/cm$^2$, and pulse durations within the range of 100 femtoseconds to 1 millisecond;

(B) irradiating a single area of the surface of the material substrate to be treated with at least 50 pulses of radiation from said laser, said radiation having an energy density of between 0.01 to 15 J/cm$^2$, said pulses having duration of between 100 femtoseconds to 1 millisecond, thereby producing semi-periodic microscale surface structures of less than 200 microns in magnitude on the surface of said materials;

(C) depositing onto said material substrate a film of a material having properties different from said material substrate using conventional vapor deposition techniques.

2. The method of claim 1, further comprising the step of acid etching the surface of the material substrate after said laser treatment step and before said vapor deposition step.

3. The method of claim 1, where said irradiating step is performed in ambient air and pressure.

4. The method of claim 1, where said irradiating step is performed in vacuum.

5. The method of claim 1, where said irradiating step is performed in light gas atmosphere.

6. The method of claim 1, where said irradiating step is performed at an angle normal to said surface.

7. The method of claim 1, where said irradiating step is performed at an angle other than normal to said surface.

8. The method of claim 1, where said beam is scanned over said surface.

9. The method of claim 1, where said radiation has an energy density of from 2 to 8 J/cm$^2$.

10. The method of claim 1, where said film is deposited to a thickness between 0.25 and 250 microns.

11. The method of claim 1, further comprising the step of acid etching the surface of the material substrate at the same time as said laser treatment step.

12. The method of claim 2, where said irradiating step is performed in ambient air and pressure.

13. The method of claim 2, where said irradiating step is performed in vacuum.

14. The method of claim 2, where said irradiating step is performed in light gas atmosphere.

15. The method of claim 2, where said irradiating step is performed at an angle normal to said surface.

16. The method of claim 2, where said irradiating step is performed at an angle other than normal to said surface.

17. The method of claim 2, where said beam is scanned over said surface.

18. The method of claim 2, where said radiation has an energy density of from 2 to 8 J/cm$^2$.

19. The method of claim 2, where said film is deposited to a thickness between 0.25 and 250 microns.

* * * * *